US010274263B2

(12) United States Patent
Arik et al.

(10) Patent No.: US 10,274,263 B2
(45) Date of Patent: Apr. 30, 2019

(54) METHOD AND APPARATUS FOR IMPROVED COOLING OF A HEAT SINK USING A SYNTHETIC JET

(75) Inventors: Mehmet Arik, Niskayuna, NY (US); Yogen Vishwas Utturkar, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 1783 days.

(21) Appl. No.: 13/074,700

(22) Filed: Mar. 29, 2011

(65) Prior Publication Data

US 2011/0174462 A1    Jul. 21, 2011

Related U.S. Application Data

(63) Continuation-in-part of application No. 12/421,068, filed on Apr. 9, 2009, now Pat. No. 8,496,049.

(51) Int. Cl.
*F28F 3/02* (2006.01)
*H01L 23/467* (2006.01)

(52) U.S. Cl.
CPC ............ *F28F 3/022* (2013.01); *H01L 23/467* (2013.01); *H01L 2924/0002* (2013.01); *Y10T 29/4935* (2015.01)

(58) Field of Classification Search
CPC ........ F28F 3/022; H01L 23/467; F04B 41/06; F04D 25/16; F04D 25/166; F04F 5/54
USPC ................... 165/80.3, 96, 908; 361/695, 697
See application file for complete search history.

(56) References Cited

U.S. PATENT DOCUMENTS

| 2,766,619 A | 10/1956 | Tribus et al. |
| 3,692,414 A | 9/1972 | Rosteman |
| 3,710,128 A | 1/1973 | Kubisiak |
| 4,583,854 A | 4/1986 | Lozar |
| 4,684,891 A | 8/1987 | Feinberg |
| 4,698,592 A | 10/1987 | Feinberg |
| 4,736,247 A | 4/1988 | Graham |
| 4,745,290 A | 5/1988 | Frankel |

(Continued)

FOREIGN PATENT DOCUMENTS

| CN | 1471159 A | 1/2004 |
| DE | 218672 A1 | 2/1985 |

(Continued)

OTHER PUBLICATIONS

G F Dalgleish, R D James and K H Randeree, University of Hull; D R Aitchison, University of Teeside; Title:Laser-based inspection of cutting tools for advanced manufacturing system; http://ieeexplore.ieee.org/iel3/5058/13842/00644268.pdf?arnumber=644268.

(Continued)

*Primary Examiner* — Jon T. Schermerhorn, Jr.
(74) *Attorney, Agent, or Firm* — Ziolkoshi, Patent Solutions Group, SC; Jean K. Testa

(57) ABSTRACT

A system for cooling a device includes a heat sink comprising a substrate having a plurality of fins arranged thereon, a fan positioned to direct an ambient fluid in a first direction across the heat sink, and a first synthetic jet assembly comprising one of a multi-orifice synthetic jet and a plurality of single orifice synthetic jets. The first synthetic jet assembly is configured to direct the ambient fluid in a second direction across the heat sink, wherein the second direction is approximately perpendicular to the first direction.

20 Claims, 9 Drawing Sheets

(56) References Cited

U.S. PATENT DOCUMENTS

| | | | |
|---|---|---|---|
| 4,885,542 A | 12/1989 | Yao et al. | |
| 4,966,460 A | 10/1990 | Kahley | |
| 5,299,090 A | 3/1994 | Brady et al. | |
| 5,445,215 A * | 8/1995 | Herbert | 165/80.3 |
| 5,477,371 A | 12/1995 | Shafir | |
| 5,568,260 A | 10/1996 | Schneiter | |
| 5,570,186 A | 10/1996 | Satzger | |
| 5,708,279 A | 1/1998 | Cheng | |
| 5,781,411 A | 7/1998 | Feenstra | |
| 5,798,465 A | 8/1998 | Ziada et al. | |
| 5,846,081 A | 12/1998 | Bushway | |
| 5,940,272 A | 8/1999 | Emori et al. | |
| 6,064,205 A | 5/2000 | Zhou et al. | |
| 6,123,145 A | 9/2000 | Glezer et al. | |
| 6,128,188 A | 10/2000 | Hanners | |
| 6,166,904 A | 12/2000 | Kitahara et al. | |
| 6,185,447 B1 | 2/2001 | Alley et al. | |
| 6,232,680 B1 | 5/2001 | Bae et al. | |
| 6,269,002 B1 | 7/2001 | Azar | |
| 6,296,048 B1 | 10/2001 | Sauer | |
| 6,371,200 B1 | 4/2002 | Eaton | |
| 6,577,126 B2 | 6/2003 | Lehr | |
| 6,588,497 B1 | 7/2003 | Glezer et al. | |
| 6,666,261 B2 | 12/2003 | Yang et al. | |
| 6,722,581 B2 | 4/2004 | Saddoughi | |
| 6,788,807 B1 | 9/2004 | Norita | |
| 6,817,405 B2 | 11/2004 | Kamath et al. | |
| 6,927,863 B2 | 8/2005 | Gurny | |
| 6,937,472 B2 | 8/2005 | Pokhama | |
| 7,023,697 B2 | 4/2006 | Pokharna et al. | |
| 7,027,145 B2 | 4/2006 | Segall | |
| 7,055,329 B2 | 6/2006 | Martens et al. | |
| 7,092,254 B1 | 8/2006 | Monsef et al. | |
| 7,132,828 B2 | 11/2006 | Lustig et al. | |
| 7,204,615 B2 | 4/2007 | Arik et al. | |
| 7,249,625 B2 | 7/2007 | Duan | |
| 7,252,140 B2 | 8/2007 | Glezer et al. | |
| 7,263,837 B2 | 9/2007 | Smith | |
| 7,286,347 B2 * | 10/2007 | Wang et al. | 361/695 |
| 7,269,471 B2 | 11/2007 | Kadono | |
| 7,307,841 B2 | 12/2007 | Berlin et al. | |
| 7,327,139 B2 | 2/2008 | Ikezaki | |
| 7,336,486 B2 | 2/2008 | Mongia | |
| 7,336,986 B2 | 2/2008 | Miyoshi et al. | |
| 7,607,470 B2 | 10/2009 | Glezer et al. | |
| 7,891,410 B1 | 2/2011 | Monson et al. | |
| 7,990,705 B2 | 8/2011 | Bult et al. | |
| 8,066,410 B2 | 11/2011 | Booth et al. | |
| 8,120,908 B2 | 2/2012 | Arik et al. | |
| 8,342,819 B2 | 1/2013 | Arik et al. | |
| 8,434,906 B2 | 5/2013 | Arik et al. | |
| 2002/0154396 A1 | 10/2002 | Overbeck | |
| 2003/0177899 A1 | 9/2003 | Monson et al. | |
| 2004/0263863 A1 | 12/2004 | Rogers | |
| 2005/0121171 A1 * | 6/2005 | Mukasa et al. | 165/80.3 |
| 2006/0016581 A1 | 1/2006 | Wang et al. | |
| 2006/0021736 A1 | 2/2006 | Tran | |
| 2006/0042782 A1 | 3/2006 | Chen | |
| 2006/0196638 A1 | 9/2006 | Glezer et al. | |
| 2006/0267184 A1 | 11/2006 | Kinsman et al. | |
| 2006/0281398 A1 | 12/2006 | Yokomizo et al. | |
| 2007/0119573 A1 | 5/2007 | Mahalingam et al. | |
| 2007/0124015 A1 | 5/2007 | Chen et al. | |
| 2007/0141453 A1 | 6/2007 | Mahalingam et al. | |
| 2007/0285090 A1 | 12/2007 | Ikezaki | |
| 2008/0006393 A1 | 1/2008 | Grimm | |
| 2008/0009187 A1 | 1/2008 | Grimm et al. | |
| 2008/0041574 A1 | 2/2008 | Arik et al. | |
| 2008/0043438 A1 | 2/2008 | Refai-Ahmed | |
| 2008/0148590 A1 | 6/2008 | Hayashi | |
| 2008/0156462 A1 | 7/2008 | Arik et al. | |
| 2008/0277103 A1 | 11/2008 | Yamada et al. | |
| 2008/0295997 A1 | 12/2008 | Heffington et al. | |
| 2008/0304979 A1 | 12/2008 | Lucas | |
| 2009/0145581 A1 * | 6/2009 | Hoffman et al. | 165/80.3 |
| 2009/0174999 A1 | 7/2009 | Sauciuc et al. | |
| 2009/0321046 A1 | 12/2009 | Hernon et al. | |
| 2009/0321056 A1 | 12/2009 | Ran et al. | |
| 2010/0014251 A1 | 1/2010 | Refai-Ahmed | |
| 2010/0018675 A1 | 1/2010 | Aarts et al. | |
| 2010/0038056 A1 | 2/2010 | Ellsworth et al. | |
| 2010/0110630 A1 | 5/2010 | Arik et al. | |
| 2010/0110635 A1 | 5/2010 | Jones et al. | |
| 2011/0024092 A1 * | 2/2011 | Gerlach | 165/104.34 |
| 2011/0114287 A1 | 5/2011 | Arik et al. | |
| 2011/0139429 A1 | 6/2011 | Salapakkam et al. | |

FOREIGN PATENT DOCUMENTS

| | | |
|---|---|---|
| DE | 9110287 U1 | 10/1991 |
| EP | 0385090 A1 | 9/1990 |
| EP | 1580521 A | 9/2005 |
| EP | 1762725 A1 | 3/2007 |
| EP | 1797992 A1 | 6/2007 |
| EP | 2151863 A1 | 2/2010 |
| JP | 0340462 A | 2/1991 |
| JP | 0538985 U | 5/1993 |
| JP | 05251883 A | 9/1993 |
| JP | 09139448 A | 5/1997 |
| JP | 1051912 A | 2/1998 |
| JP | 2001332671 A | 11/2001 |
| JP | 2001345585 A | 12/2001 |
| JP | 2002026214 A | 1/2002 |
| JP | 2004121466 A | 4/2004 |
| JP | 2005011922 A | 1/2005 |
| JP | 2005191130 A | 7/2005 |
| JP | 2006522479 A | 9/2006 |
| JP | 2006310673 A | 11/2006 |
| JP | 2007162525 A | 6/2007 |
| JP | 2007192210 A | 8/2007 |
| JP | 2008008230 A | 1/2008 |
| JP | 2008196989 A1 | 8/2008 |
| JP | 2011103395 A | 5/2011 |

OTHER PUBLICATIONS

Li, Xiaoqian (Intgd. Mfg. Technologies Institute, National Research Council Canada); Wang, Lihui; Cai, Ningxu Title:Machine-vision-based surface finish inspection for cutting tool replacement in production International Journal of Production Research, v 42, n 11, Jun. 1, 2004, p. 2279-2287 Publisher:Taylor and Francis Ltd.

Yan X. Shirase K. Hirao M. Yasui T. Title: Extraction and optimisation of cutting conditions for 2 1/2-axis milling International journal, advanced manufacturing technology 2000, vol. 16, No. 10, pp. 695-699 (16 ref.) Publisher: Springer, London, Royaume-Uni.

International Search Report dated Mar. 25, 2008 for International Application No. PCT/US2007/085994 (4 pages).

EP1580521 Abstract, Sep. 28, 2005.

Utturkar et al. Title: Assessment of Cooling Enhancement of Synthetic Jet in Conjunction with Forced Convection ASME International Mechanical Engineering Congress and Exposition Nov. 11-15, 2007, Seattle, WA (5 pages).

Mahalingam et al. Title: Thermal Management Using Synthetic Jet Ejectors IEEE Transactions on Components and Packaging Technologies vol. 27, No. 3, Sep. 2004, pp. 439-444.

Mahalingam et al. Title: Design and Thermal Characteristics of a Synthetic Jet Ejector Heat Sink Journal of Electronic Packaging, Transactions of the ASME vol. 127, Jun. 2005, pp. 172-177.

Arik et al. Title: Interaction of a Synthetic Jet With an Actively Cooled Heat Sink IEEE, 2008, pp. 374-379.

U.S. Appl. No. 14/327,687, filed Jul. 10, 2014, Pradeep Chandra Babu Salapakkam et al.

U.S. Appl. No. 12/911,995, filed Oct. 26, 2010, Mehmet Arik et al.

U.S. Appl. No. 14/302,613, filed Jun. 12, 2014, Mehmet Arik et al.

U.S. Appl. No. 12/965,454, filed Dec. 10, 2010, Pradeep Chandra Babu Salapakkam et al.

U.S. Appl. No. 12/421,068, filed Apr. 9, 2010, Mehmet Arik et al.

U.S. Appl. No. 11/757,802, filed Jun. 4, 2007, Yoshikazu Ikezaki.

Jacobs et al., "The Characteristics of 78 Related Airfoil Sections From Tests in the Variable-Density Wind Tunnel", NACA Report No. 460, pp. 1-61, Nov. 1933.

(56) References Cited

OTHER PUBLICATIONS

Gutmark et al., "Enhancement of Heat Transfer in Plane Channels", Proceedings of the Seventh International Heat Transfer Conference, Munich,Germany, pp. 441-445, Sep. 6, 1982.

Minichiello et al., "Thermal Management of Sealed Electronic Enclosures using Synthetic Jet Technology", Advances in Electronic Packaging, Volume No. 2, Issue No. 19, pp. 1809-1812, 1997.

Black et al., "Heat Transfer Modules for Cooling Electronics Packages", Advanced Packaging Materials, Proceedings. 1998 4th International Symposium, pp. 209-214, Mar. 1998.

Negus et al., "Resistance of Circular Contacts on Coated Surfaces: Effect of Boundary Conditions", J. Thermophysics Volume No. 2, Issue No. 2, pp. 158-164, 1998.

Lee et al., "DNS of micro jets for turbulent boundary layer control", 39th Aerospace Sciences Meeting and Exhibit, Reno, NV, AIAA 2001-1013, pp. 1-13, 2001.

Mittal et al., "On Virtual Aero-Shaping Effect of Synthetic Jets", Physics. Fluids, Volume No. 14, Issue No. 4, pp. 1553-1536, 2002.

Garg et al., "Micro Fluidic Jets for Thermal Management of Electronics", Proc. ASME Heat Transfer/Fluids Engineering Summer Conference, Charlotte,North Carolina, FED F-346, Volume No. 4, pp. 647-654, Jul. 11, 2004.

Acikalin et al., "Piezoelectric Actuators for Low-Form-Factor Electronics Cooling", The ASME/Pacific Rim Technical Conference and Exhibition on Integration and Packaging of Micro, Nano, and Electronic Systems (InterPACK '05), pp. 4339-4343, Jul. 17, 2005.

Erbas et al., "Synthetic Jets for Thermal Management of Microelectronic Chips", Microelectromechanical Systems, Proceeding of ASME IMECE 2005, IMECE 2005-81419, Orlando, FL, pp. 273-277, Nov. 5, 2005.

Garg et al., "Advanced Localized Air Cooling with Synthetic Jets", ASME Journal of Electronics Packaging, Volume No. 127, pp. 503-511, Dec. 2005.

Seeley et al., "Coupled Acoustic and Heat Transfer Modeling of a Synthetic Jet", 47th AIAA/ASME/ASCE/AHS/ASC Structures, Structural Dynamics and Materials Conference, pp. 1-13, May 1, 2006.

Arik, "An Investigation into Feasibility of Impingement Heat Transfer and Acoustic Abatement of Meso scale Synthetic Jets", Applied Thermal Engineering, pp. 1483-1494, Jun. 2006.

David B. Go et al., "Ionic Winds for Locally Enhanced Cooling", Journal of Applied Physics, Volume No. 102, Issue No. 5, pp. 1-9, 2007.

Arik et al., "Energy Efficiency of Low Form Factor Cooling Devices", ASME International Mechanical Engineering Congress and Exposition, Seattle, WA, pp. 1347-1354, Nov. 11, 2007.

US Non-Final Office Action issued in connection with corresponding U.S. Appl. No. 11/757,802 dated Dec. 28, 2007.

Arik, "Local Heat Transfer Coefficients of a High Frequency Synthetic Jets During Impingement Cooling Over Flat Surfaces", Heat Transfer Engineering, Volume No. 29, Issue No. 9, pp. 763-773, 2008.

Utturkar et al., "An Experimental and Computational Heat Transfer Study of Pulsating Jets", J. Heat Transfer, Volume No. 130, Issue No. 6, pp. 1-10, Apr. 23, 2008.

US Non-Final Office Action issued in connection with corresponding U.S. Appl. No. 11/757,802 dated Jul. 9, 2008.

Li et al., "Enhancement of Natural Convection using Synthetic Jets", GE Global Research, Benjamin Vanderploeg, Electronics Design ECOE, pp. 1-8, 2010.

Salapakkam et al., "Augmenting Forced Convection Heat Transfer Coupled with an Aerodynamic Surface a Synthetic Jet", General Electric Global Research Center, pp. 1-9, 2010.

European Search Report and Opinion issued in connection with corresponding EP Application No. 10158793.9 dated Aug. 24, 2012.

US Non-Final Office Action issued in connection with corresponding U.S. Appl. No. 12/421,068 dated Sep. 27, 2012.

European Search Report and Opinion issued in connection with corresponding EP Application No. 11186013.6 dated Dec. 18, 2012.

US Non-Final Office Action issued in connection with corresponding U.S. Appl. No. 12/965,454 dated Aug. 5, 2013.

US Notice of Allowance Office Action issued in connection with corresponding U.S. Appl. No. 12/911,995 dated Dec. 23, 2013.

Unofficial English translation of Japanese Office Action issued in connection with corresponding JP Application No. 2010088256 dated Jan. 28, 2014.

US Final Office Action issued in connection with corresponding U.S. Appl. No. 12/965,454 dated Feb. 4, 2014.

US Non-Final Office Action issued in connection with corresponding U.S. Appl. No. 12/965,454 dated Dec. 1, 2014.

Japanese Office Action issued in connection with corresponding JP Application No. 2011230218 dated Mar. 3, 2015.

Chinese Office Action issued in connection with corresponding CN Application No. 201110354647.0 dated Mar. 31, 2015.

US Final Office Action issued in connection with corresponding U.S. Appl. No. 12/965,454 dated Mar. 26 2015.

US Non-Final Office Action issued in connection with corresponding U.S. Appl. No. 12/911,995 dated Jun. 18, 2015.

I Phone 6 S, The Only Thing That's Changed is Everything, "http://www.apple.com/iphone/", pp. 1-8, Jan. 7, 2016.

"Welcome to the World of Ventilation and Motor Engineering", http://www.ebmpapst.us/, pp. 1, Jan. 7, 2016.

Dittus et al., "Heat Transfer in Automobile Radiators of the Tubular Type", University of California Publications on Engineering, Volume No. 2, Issue No. 13, pp. 443-461, Oct. 17, 1930.

Messiter et al., The Vertical Plate in Laminar Free Convection: Effects of Leading and Trailing Edges and Discontinuous Temperature, Journal of Applied Mathematics and Physics, Volume No. 27, pp. 633-651, 1976.

Moffat "Describing the Uncertainties in Experimental Results", Experimental Thermal and Fluid Science, Volume No. 01, pp. 3-17, 1988.

Gilarranz et al., "Compact, High-Power Synthetic Jet Actuators for Flow Separation Control", AIAA Aerospace Sciences Meeting and Exhibit, pp. 1-15, Jan. 8-11, 2001.

Glezer et al., "Synthetic Jets", Annual Review of Fluid Mechanics, Volume No. 34, pp. 503-529, 2002.

Smith et al., "Jet Vectoring Using Synthetic Jets", Fluid Mechanics, Volume No. 458, pp. 1-34, May 2002.

Beratlis et al., "Optimization of Synthetic Jet Cooling for Microelectronics Applications", Semiconductor Thermal Measurement and Management Symposium, pp. 66-73, 2003.

Moran., "An Introduction to Theoretical and Computational Aerodynamics", Dover, ISBN 0486428796, pp. 7, 2003.

Kotapati et al. "Time-Accurate Three-Din1ensional Simulations of Synthetic Jets in Quiescent Air", 2005.

Bahadur et al., "Thermal Design and Optimization of Natural Convection Polymer Pin Fin Heat Sinks", IEEE Transactions on Components and Packaging Technologies, Volume No. 28, Issue No. 2, pp. 238-246, Jun. 2005.

Arik et al., "Electronics Packaging Cooling: Technologies from Gas Turbine Engine Cooling", Electronic Packaging, Volume No. 128, Issue No. 3, pp. 215-225, Sep. 2006.

Pavlova et al., "Electronic Cooling Using Synthetic Jet Impingement", Heat Transfer, Volume No. 128, Issue No. 9, pp. 897-907, Sep. 20, 2006.

Wang et al., "Optimization of Synthetic Jet Fluidic Structures in Printed Wiring Boards", Electronic Packaging, Volume No. 128, Issue No. 4, pp. 353-359, Dec. 2006.

US Non-Final Office Action issued in connection with Related U.S. Appl. No. 12/759,899 dated May 30, 2013.

US Final Office Action issued in connection with Related U.S. Appl. No. 12/759,899 dated Aug. 23, 2013.

Unofficial English Translation of Japanese Office Action issued in connection with Related JP Application No. 2010088256 dated Feb. 4, 2014.

Unofficial English Translation of Chinese Office Action issued in connection with Related CN Application No. 201110109628.1 dated Oct. 31, 2014.

Unofficial English Translation of Japanese Office Action issued in connection with Related JP Application No. 2011084147 dated Jan. 6, 2015.

(56) References Cited

OTHER PUBLICATIONS

Unofficial English Translation of Japanese Office Action issued in connection with Related JP Application No. 2011084147 dated Aug. 4, 2015.
Unofficial English Translation of Japanese Notice of Allowance issued in connection with Related JP Application No. 2011084147 dated Dec. 8, 2015.
US Non-Final Office Action issued in connection with Related U.S. Appl. No. 14/449,452 dated Jan. 20, 2016.
US Non-Final Office Action issued in connection with Related U.S. Appl. No. 14/449,680 dated Mar. 11, 2016.
US Final Office Action issued in connection with Related U.S. Appl. No. 14/449,452 dated Jun. 3, 2016.
US Notice of Allowance issued in connection with Related U.S. Appl. No. 14/327,629 dated Jun. 16, 2016.

* cited by examiner

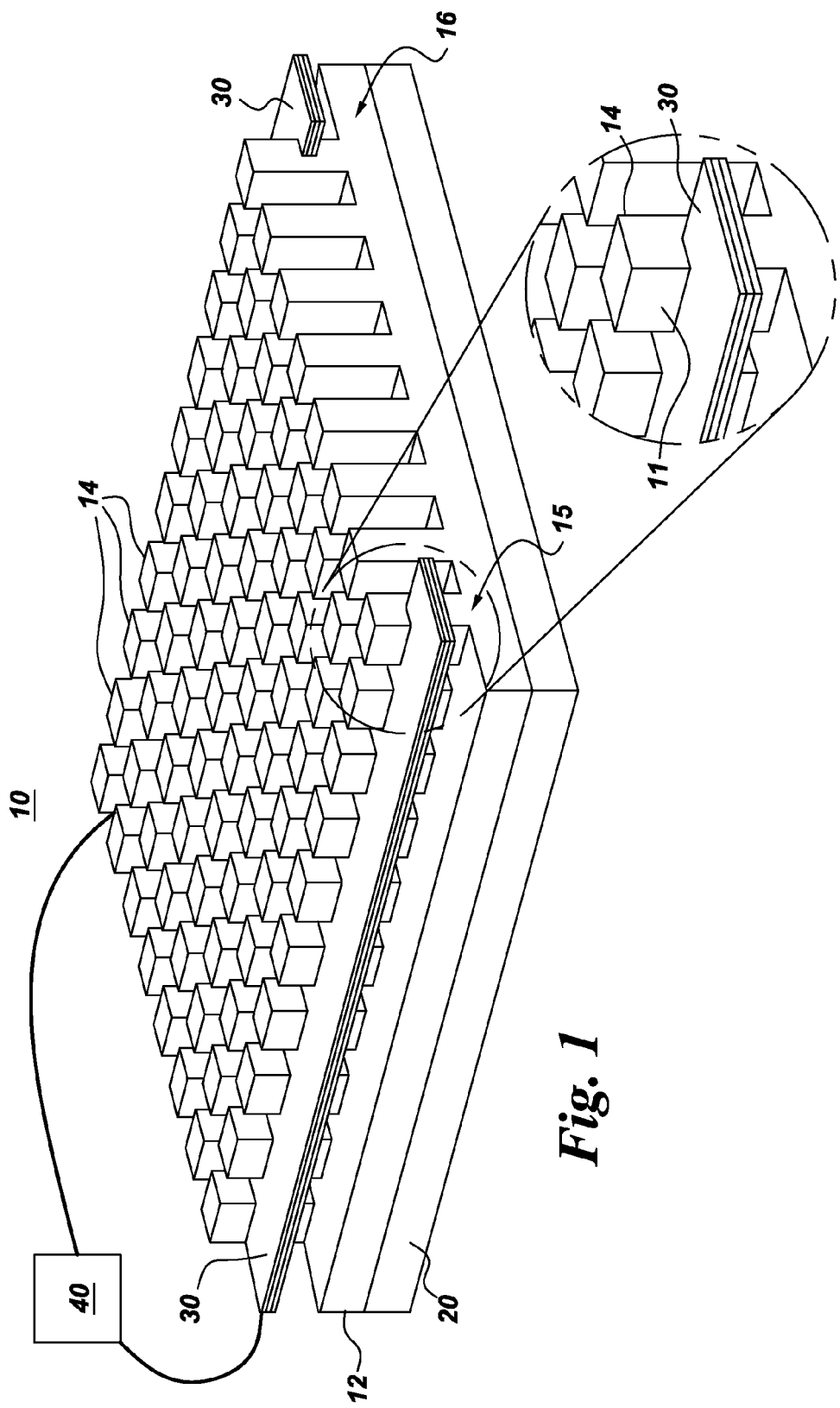

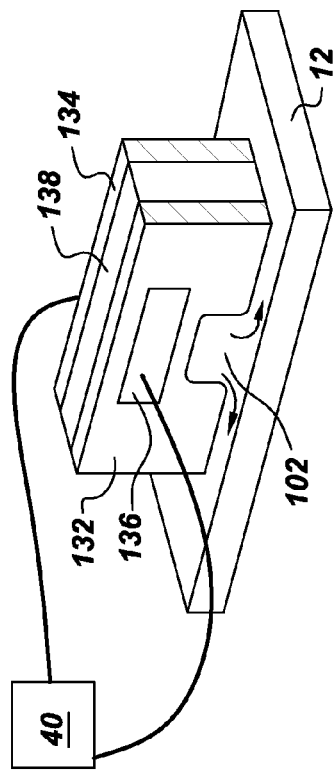
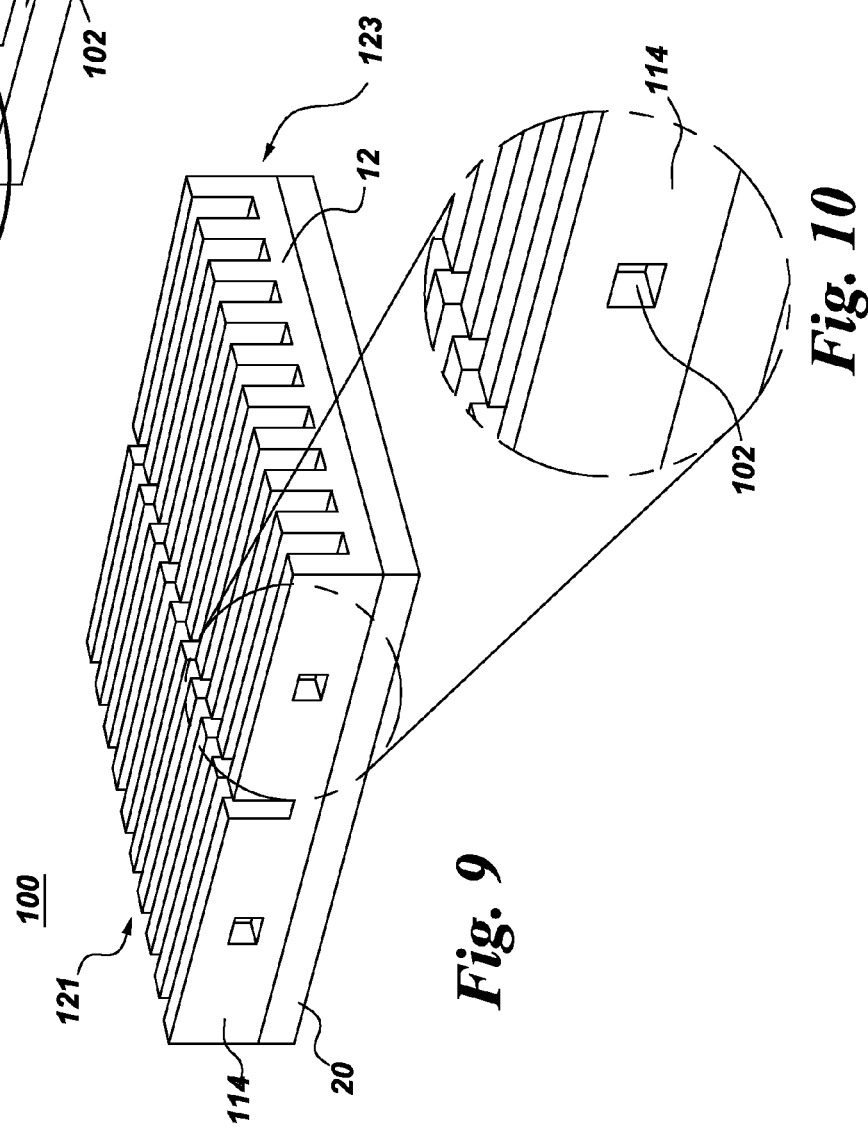

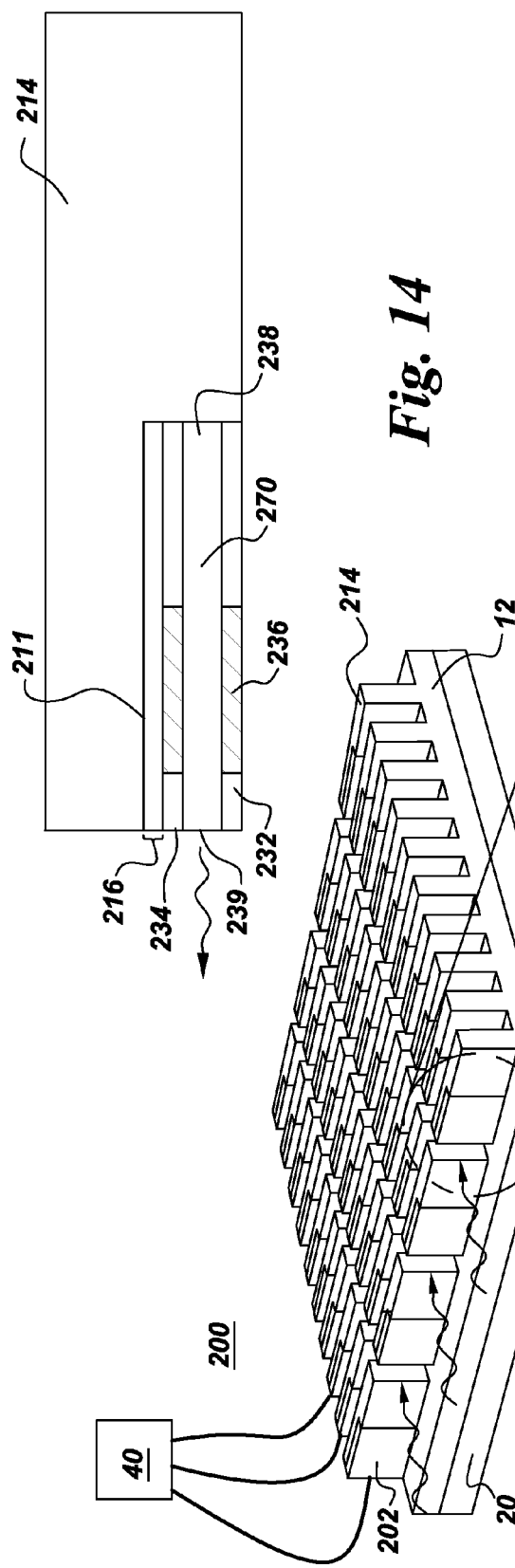
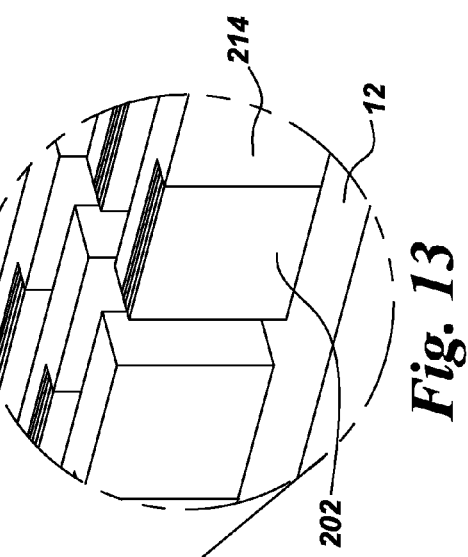
Fig. 12
Fig. 13
Fig. 14

METHOD AND APPARATUS FOR IMPROVED COOLING OF A HEAT SINK USING A SYNTHETIC JET

CROSS-REFERENCE TO RELATED APPLICATION

The present application is a continuation-in-part of, and claims priority to, U.S. non-provisional application Ser. No. 12/421,068, filed Apr. 9, 2009, the disclosure of which is incorporated herein by reference.

BACKGROUND OF THE INVENTION

The invention relates generally to thermal management systems, and more particularly to thermal management systems for use in embedded environments.

Environments having embedded electronic systems, hereinafter embedded environments or heated environments, offer challenges for thermal management. Such systems produce waste heat as a part of their normal operation, heat that must be removed for proper performance and reliability of the embedded electronics. The design of thermal management systems to provide cooling for embedded electronics is a formidable challenge due to space limitations. Examples of embedded electronic systems include single board computers, programmable logic controllers (PLCs), operator interface computers, laptop computers, cell phones, personal digital assistants (PDAs), personal pocket computers, and other small electronic devices, there is a limited amount of available space for thermal management systems. It has been known to use passive cooled heat sinks or forced air-cooling as thermal management systems to assist in the removal of heat from electronic components. Further, it has been known that conducting the heat generated by electronic components to a printed circuit board, on which they are mounted, provides a migration of the heat from a smaller area to a larger area. However, such techniques have limited heat removal capabilities.

Accordingly, there is a need for improved thermal management systems for embedded electronic systems.

BRIEF DESCRIPTION

In accordance with one aspect of the invention, a system for cooling a device includes a heat sink comprising a substrate having a plurality of fins arranged thereon, a fan positioned to direct an ambient fluid in a first direction across the heat sink, and a first synthetic jet assembly comprising one of a multi-orifice synthetic jet and a plurality of single orifice synthetic jets. The first synthetic jet assembly is configured to direct the ambient fluid in a second direction across the heat sink, wherein the second direction is approximately perpendicular to the first direction.

In accordance with another aspect of the invention, a method of fabricating a system for cooling an electronic device includes positioning a fan adjacently to a heat sink such that air flow from the fan is directed in a first direction through an array of fins of the heat sink. The method also includes positioning a first synthetic jet assembly adjacently to the heat sink such that air flow from the first synthetic jet assembly is directed in a second direction through the array of fins of the heat sink, wherein the second direction is approximately perpendicular to the first direction. The first synthetic jet assembly comprises one of a multi-orifice synthetic jet and a plurality of single orifice synthetic jets.

In accordance with another aspect of the invention, a cooling system includes a fan disposed adjacently to a heat sink to direct a first stream of ambient fluid through an array of fins of the heat sink and a first multi-orifice synthetic jet positioned adjacently to the heat sink to direct a second stream of ambient fluid through the array of fins of the heat sink. The first multi-orifice synthetic jet is positioned with respect to the fan such that the second stream of ambient fluid is approximately perpendicular to the first stream of ambient fluid.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings:

FIG. 1 illustrates a heat sink with distributed jet cooling.

FIG. 2 is an enlarged view of a portion of the heat sink of FIG. 1 at a synthetic jet.

FIG. 9 illustrates another heat sink embodiment of the invention with distributed and integrated jet cooling.

FIG. 10 is an enlarged view of a portion of the heat sink of FIG. 9 at a synthetic jet.

FIG. 11 schematically depicts a single plate fin with an integrated synthetic jet for use in the heat sink of FIGS. 9 and 10.

FIG. 12 illustrates another heat sink embodiment of the invention with distributed and integrated jet cooling.

FIG. 13 is an enlarged view of a portion of the heat sink of FIG. 12 showing several synthetic jets.

FIG. 14 schematically depicts, in cross-sectional view, an example configuration of a synthetic jet for use in the heat sink shown in FIGS. 12 and 13.

DETAILED DESCRIPTION

Figure 3:
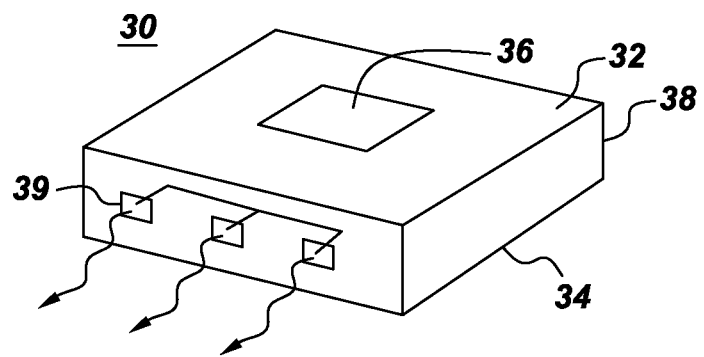
FIG. 3 depicts an example configuration for a multi-orifice synthetic jet for use in the heat sink of FIGS. 1 and 2.

FIGS. 1 and 2 illustrate a heat sink 10 with distributed jet cooling. As shown, for example, in FIG. 1, the heat sink comprises a base 12 for thermal connection to at least one heated object 20. The heated object 20 may be any object requiring cooling, non-limiting examples of which include high power processors and power electronics. The base 12 (base plate or sink plate) can be formed of a variety of thermally conductive materials, as known in the art. The heat sink 10 further includes an array of fins 14 thermally coupled to the base. The fins may be arranged in a two-dimensional array of "pin fins" as shown, for example in FIG. 1. For other arrangements, the fins 14 may take the form of a one-dimensional array of "plate fins" defining slots between them, as shown for example in FIGS. 7 and 8. Briefly, the heat from the heated object 20 is transferred into the base 12, which in turn transfers heat into the fins 14. The fins 14 increase the surface area for heat transfer for cooling the heated body 20.

In the illustrated example, the heat sink 10 further includes at least one multi-orifice synthetic jet 30 disposed on a side 15, 16 of the array of fins. In other example arrangements, multiple single jets are disposed on the respective side 15, 16 of the array of fins. The multiple single jets are similar to the multi-orifice synthetic jets discussed herein, except that that the single jets include a single orifice. For the example illustrated in FIG. 3, each of the multi-orifice synthetic jets 30 comprises a first flexible structure 32, a second flexible structure 34, at least one active material 36 coupled to at least one of the first and second flexible structures, and a compliant wall 38 positioned between the first and second flexible structures and defining a chamber. As indicated in FIG. 3, the compliant wall defines multiple orifices 39 for facilitating fluid communication between the chamber and an ambient environment of the fins 14. It should be noted that the number of orifices shown in FIG. 3 is merely illustrative and is non-limiting. In one non-limiting example, the compliant wall 38 comprises an elastomer. Other example materials for the compliant wall 38 include, without limitation, polymers, glues, adhesives, metals, and composites.

In the illustrated arrangement of FIG. 3, the active material 36 is positioned on both of the first and second flexible structures 32, 34. It should be noted that the locations of the active materials 36 on the flexible structures 32, 34 shown in the figures are purely illustrative, and the invention is not limited to any specific locations of active materials. In particular embodiments, the active material is coextensive with the respective flexible structure. In other embodiments, the active material extends over only a portion of the flexible structure. The active material can take the form of a single continuous portion. Alternatively, multiple discontinuous portions of the active material can be employed to actuate respective ones of the flexible structures. A suitable active material is one, which is capable of creating stress resulting from an electrical stimulus.

Examples of suitable active material include piezoelectric material, magnetostrictive material (magnetic fields from coils attract/oppose one another), shape-memory alloy, and motor imbalance (motor with a mass imbalance creates oscillatory motion). Within the subset of piezoelectric materials, suitable active materials include bimorph piezoelectric configurations, where two piezo layers are energized out of phase to produce bending; thunder configurations, where one piezo layer is disposed on a pre-stressed stainless steel shim; buzzer element configurations, where one piezo layer is disposed on a brass shim; and MFC configurations, where a piezo fiber composite on a flexible circuit is bonded to a shim. The active material may incorporate a ceramic material.

Figure 4:
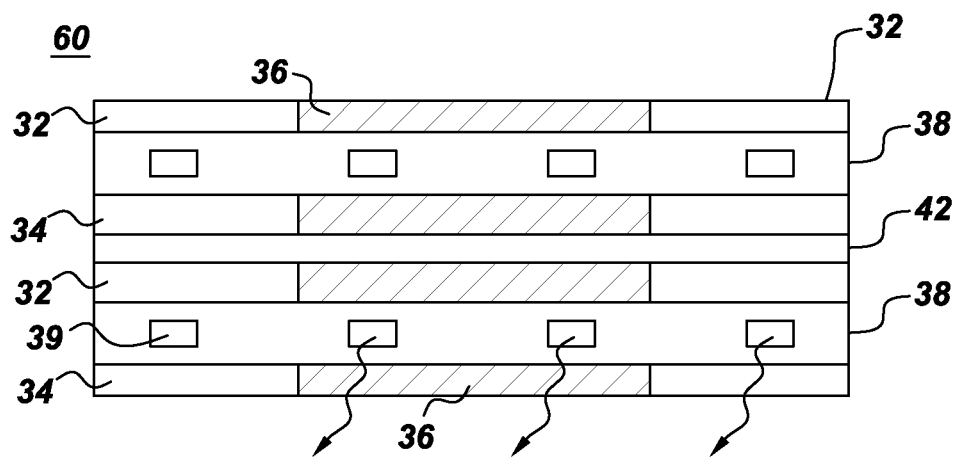
FIG. 4 depicts an example multi-stack synthetic jet assembly for use in the heat sink of FIGS. 1 and 2.

As indicated in FIG. 4, the heat sink 10 may comprise a stack 60 of the single or multi-orifice synthetic jets 30. Similar to the arrangement described with reference to FIGS. 1 and 2, the stack 60 is disposed on one of the sides 15, 16 of the array of fins 14. Although FIG. 4 depicts a stack of two multi-orifice synthetic jets, the stack 60 may include any number of synthetic jets depending on the cooling application (for example, on the fin 14 height). The synthetic jets 30 may be separated by a spacer 42, as indicated in FIG. 4. In one non-limiting example, the spacer 42 comprises plastic.

Figure 5:
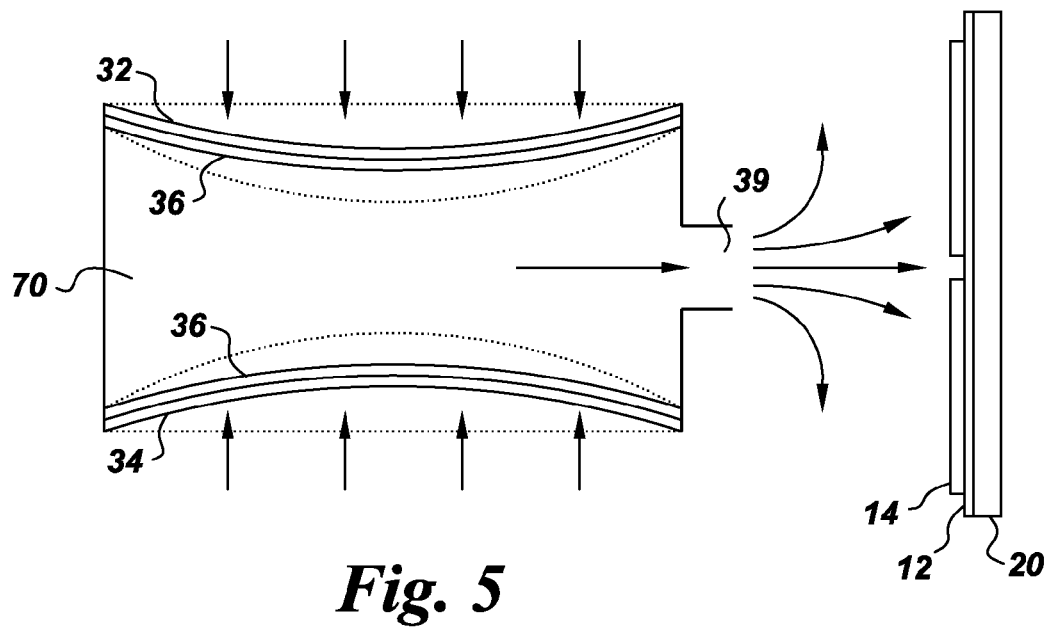
FIG. 5 illustrates the expulsion of ambient air from a chamber in response to contraction of the flexible chamber walls.
Figure 6:
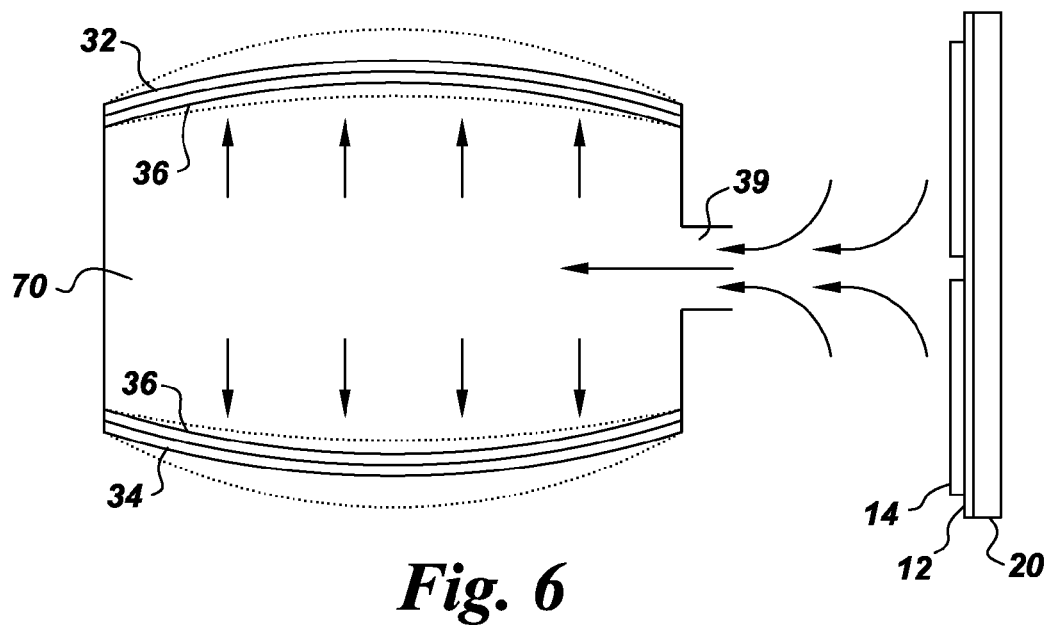
FIG. 6 illustrates the ingestion of air into the chamber in response to expansion of the flexible chamber walls.

As schematically depicted in FIG. 1, a synthetic jet driver 40 is provided to apply an electrical current to the at least one active material 36, to form streams of ambient air. The synthetic jet driver 40 can be electrically coupled to the active material 136 using wires or flexible interconnects, for example. Briefly, electrical current from synthetic jet driver 40 is received by the active material, and transformed into mechanical energy. As shown, for example in FIG. 5, the active material 36 creates stress on the flexible walls 32, 34, causing them to flex inwardly, resulting in a chamber volume change and an influx of ambient air into the chamber 70, and then outwardly, thereby ejecting the ambient air from the chambers 70 via the orifices 39. Similarly, as illustrated in FIG. 6, when the active material 36 creates stress on the flexible chamber walls 32, 34 causing them to expand, resulting in another chamber volume change, ambient air is drawn into the chamber 70 via the orifices 39. In this manner, the driver 40 actuates the jets 30. The synthetic jet driver 40 may be co-located with the other heat sink elements or may be remotely located. The current may be provided as a sine wave, a square wave, a triangular wave, or any other suitable waveform, and it should be appreciated that the current is not to be limited to any specific waveform. However, it has been found that currents having lower harmonics, such as, for example, a sine wave, may be used to provide a quieter synthetic jet 30. The voltage level for the electrical current may be between 1 and 150 volts but is not so limited. The frequency of the current may be between 2 and 300 hertz for embodiments requiring reduced noise, and between 300 hertz and 15 kilohertz for embodiments that do not require reduced noise levels.

For the example arrangement depicted in FIGS. 1 and 2, the heat sink 10 comprises multiple multi-orifice synthetic jets 30 disposed on respective sides 15, 16 of the array of fins 14. In particular, for the arrangement of FIG. 1, there are two multi-orifice synthetic jets 30 disposed on the respective sides 15, 16 of the array of fins 14. As indicated by the arrows in FIG. 2, for this example arrangement, the orifices may be disposed, so as to direct air between the fins 14 and to draw air from between the fins 14.

The orifices 39 may be configured in a variety of arrangements depending on the desired cooling flow and on the configuration of the array of fins 14. In one example arrangement, at least a subset of the orifices 39 are positioned to eject an ambient fluid directly on the fins 14. In another example arrangement, at least a subset of the orifices 39 are oriented at an angle transverse to an opposing surface 11 of the fins 14. For certain configurations, the ambient fluid is ejected perpendicular to a plane of the fins 14, as indicated for example in FIG. 5.

Figure 7:
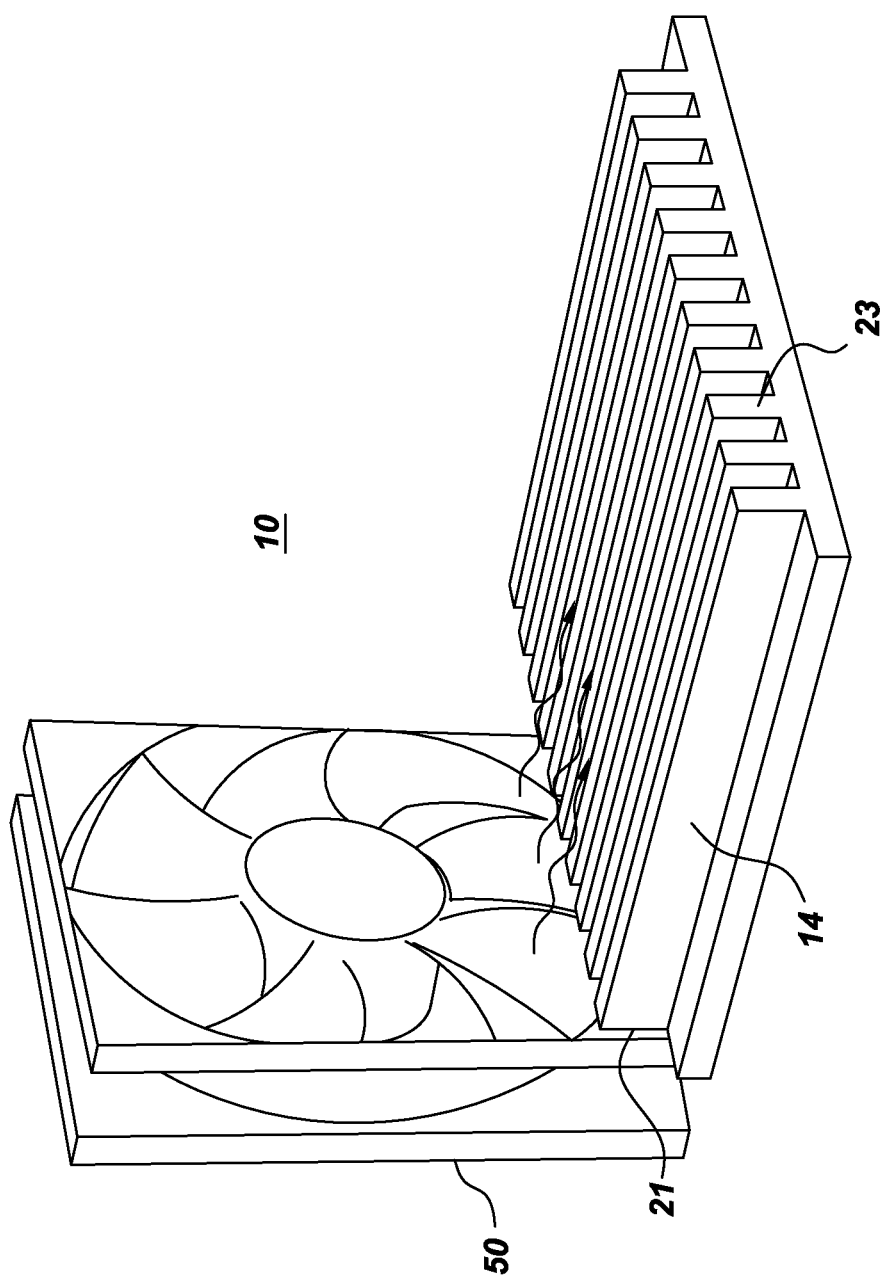
FIG. 7 illustrates a first fan location for a heat sink embodiment of the invention.
Figure 8:
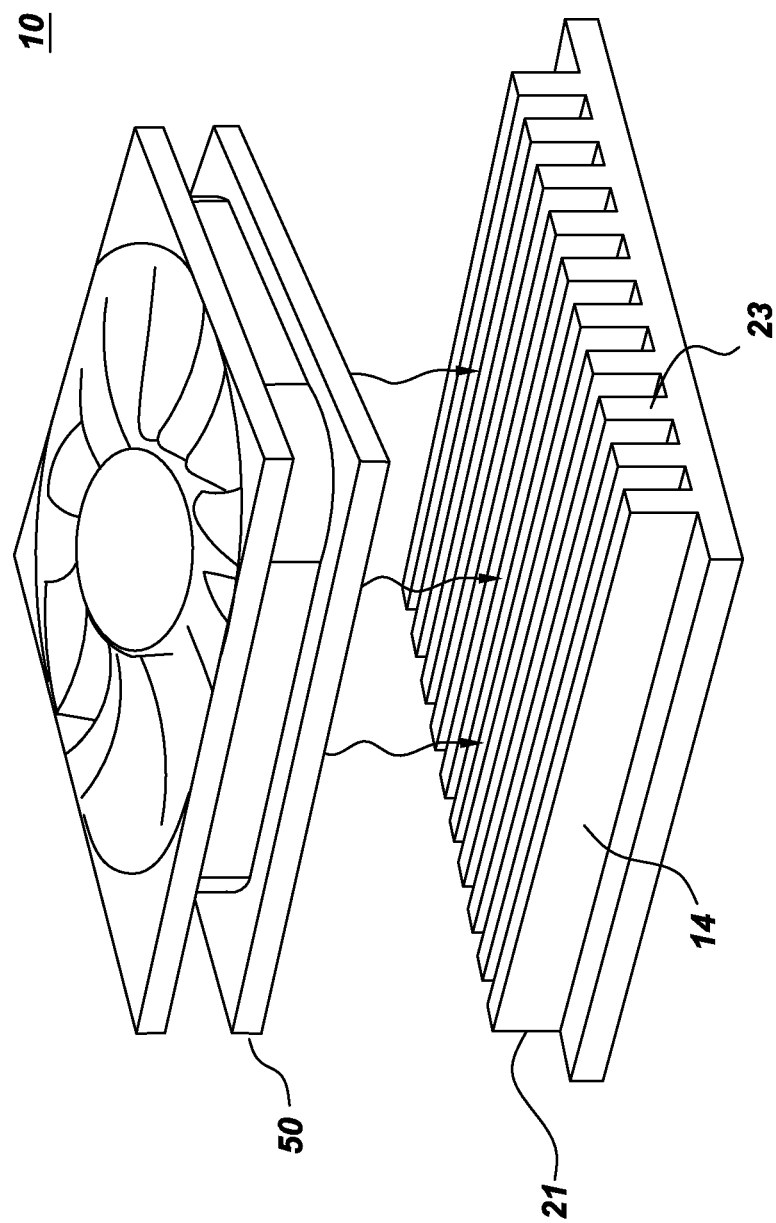
FIG. 8 illustrates a second fan location for a heat sink embodiment of the invention.

As shown, for example, in FIG. 7, for particular embodiments, the heat sink 10 further comprises a fan 50 disposed on one of an inlet and an outlet side 21, 23 of the array of fins 14. The fan 50 is configured to draw the ambient fluid through the fins 14, and the ambient fluid drawn by the fan 50 interacts with the ambient fluid ejected from the multi-orifice synthetic jets or from the multiple single jets to further enhance the cooling by at least ten percent (10%) relative to a jet-free condition. For configurations having the fan 50 disposed at the inlet side 21 of the fins 14, the fan 50 is configured to push flow towards the array of fins. Similarly, fans 50 disposed at the outlet side 23 of the array of fins are configured to pull flow through the array. FIG. 8 illustrates another arrangement, in which the fan 50 is disposed above the array of fins 14 and configured to blow an ambient fluid on the fins 14.

Figure 15:
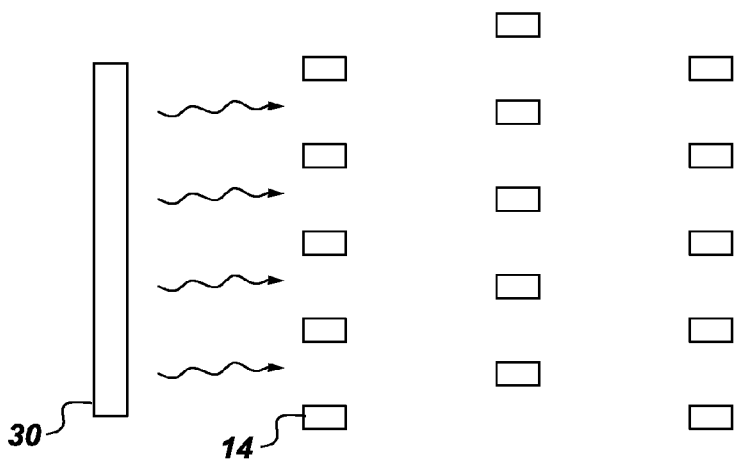
FIG. 15 illustrates a v-groove configuration for the heat sink of FIGS. 1-6.
Figure 16:
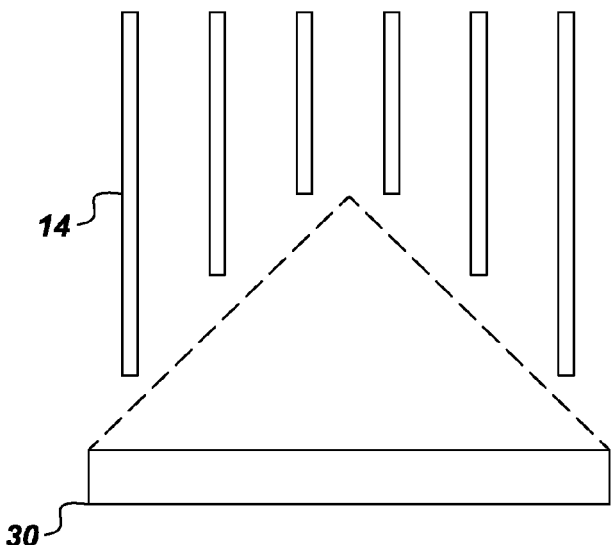
FIG. 16 illustrates a v-groove plate fin configuration.

A number of different fin configurations can be employed for the heat sink of FIGS. 1-6. For the arrangement depicted in FIG. 1, the fins 14 are pin fins and are arranged in a regular array. FIG. 15 illustrates another pin fin configuration for the heat sink 10 of FIGS. 1-6, in which the fins 14 are staggered (offset) to provide a v-groove cooling configuration. FIG. 16 illustrates a v-groove plate fin configuration. Under specific circumstances, computer simulation results have demonstrated a thirty percent performance enhancement for the v-groove configuration relative to the conventional plate fin arrangement shown for example in FIGS. 7 and 8. This enhanced cooling is due in large part to more efficient confinement of the vortices in the v-groove heat sink fin arrays. Unlike the air flow from a fan, the flow field surrounding the vortex dipoles consists of velocity vectors which are not largely parallel to the heat sink fin gaps. As a result, as these vortices approach a conventional heat sink (without grooving), their local approach velocities may not be well-aligned with the fin gaps, causing an imperfect transfer of momentum to the air in the gaps. The v-grooving improves the entrapment of this momentum contained within the dipoles and enhances the heat transfer off the heat sink. It should be noted that although FIGS. 15 and 16 show v-groove configurations with symmetric v-grooves, the invention is not limited to these arrangements and can also employ asymmetric v-groove configurations. Similarly, although FIGS. 15 and 16 show v-grooves with centerlines aligned with the respective centerlines of the jets, offset arrangements may also be employed, in which the centerlines of the v-grooves are offset from the centerlines of the jets. Similarly, combinations of these arrangements may also be employed (asymmetric v-grooves that are offset for the respective jets).

FIGS. 9-11 illustrate another heat sink 100 embodiment of the invention with distributed and integrated jet cooling. As shown for example in FIG. 9, the heat sink 100 includes a base 12 for thermal connection to at least one heated object 20. As discussed above, the invention is not limited to cooling a specific type of heated object, but rather can be used to cool a variety of heated objects. The heat sink 100 further includes an array of fins 114 thermally coupled to the base 12. For the example configuration shown in FIG. 9, a two-dimensional array of "plate fins" is employed. Respective ones of at least a subset of the fins comprise a synthetic jet 102 configured to eject an ambient fluid into an ambient environment of the fins and base. In specific embodiments, a synthetic jet 102 is inset into each of the fins 114. The synthetic jets 102 are shown in greater detail in FIG. 10.

FIG. 11 schematically depicts a single plate fin 114 with an integrated synthetic jet for use in the heat sink of FIGS. 9 and 10. As shown in FIG. 11, each of the fins 114 with an integrated jet 102 comprises a first flexible structure 132, a second structure 134, and at least one active material 136 coupled to the first flexible structure 132. The active material 136 is discussed above with reference to heat sink 10. For the integrated embodiment of FIGS. 9-11, example materials for the flexible structures 132, 134 include, without limitation, metal-based materials, such as aluminum and copper, composite structures, for example, carbon fiber filled materials, and thermally conductive polymer based materials. A compliant wall 138 is positioned between the first and second structures 132, 134 thereby forming a chamber. The compliant wall 138 defines at least one orifice 139 for facilitating fluid communication between the chamber and the ambient environment.

According to a more particular embodiment, the second structure 134 is flexible, and the active material 136 is coupled to at least one of the first and second flexible structures 132, 134. In more particular embodiments, active material 136 is coupled to both flexible structures 132, 134, such that both of these walls are actuated. As discussed above, the active material can take the form of a single continuous portion. Alternatively, multiple discontinuous portions of the active material can be employed to actuate respective ones of the flexible structures.

Figure 17:
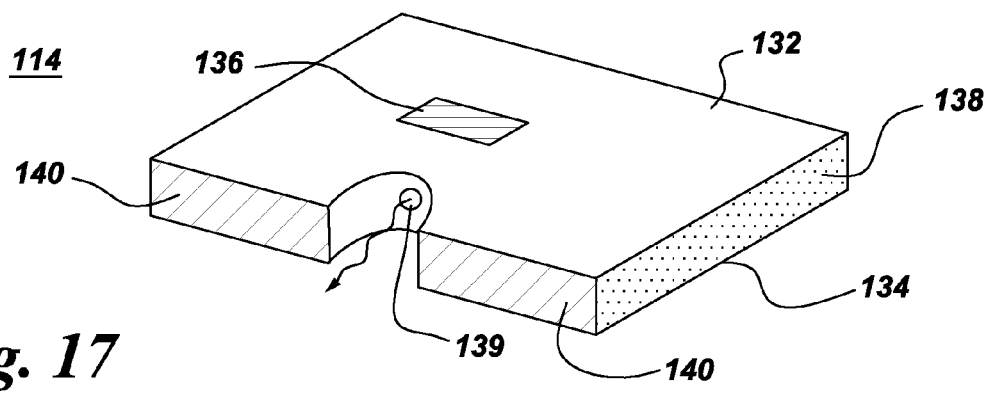
FIG. 17 illustrates a particular configuration of the fin of FIGS. 9-11 with enhanced thermal coupling to the base of the heat sink.

FIG. 17 illustrates a particular configuration of the fin 114 of FIGS. 9-11 with enhanced thermal coupling to the base of the heat sink. For the example configuration shown in FIG. 17, each of the fins 114 with an integral jet further comprises at least one thermally conductive portion 140 extending between the first and second structures 132, 134 and disposed to thermally couple the fin to the base 12. In the illustrated example shown in FIG. 17, the fin 114 includes two thermally conductive portions 140. Non-limiting example materials for the thermally conductive portions 140 include metals, such as copper. In example arrangements the thermally conductive portions 140 are attached to the base plate, for example by brazing.

For the example shown in FIG. 11, at least one synthetic jet driver 40 is provided to actuate one or more of the synthetic jets 102. The synthetic jet driver 40 can be electrically coupled to the active material 136 using wires or flexible interconnects, for example. As noted above, the synthetic jet driver 40 may be co-located with the other heat sink elements or may be remotely located. The operation of the synthetic jets 102 is similar to that of multi-orifice synthetic jets 30 described above with reference to FIGS. 5 and 6.

Advantages of the heat sink 100 embodiment described with reference to FIGS. 9-11 and 17 include a compact, relatively light design with increased surface area. In addition, the design is rugged, in that the active material is inherently protected by the fins.

Further, the synthetic jets 102 can be used alone or in combination with one or more fans 50, depending on the application. As discussed above with reference to FIG. 7, a fan 50 may be disposed on one of an inlet and an outlet side 121, 123 of the array of fins 114. The fan is configured to draw the ambient fluid through the fins 114, such that the ambient fluid drawn by the fan 50 interacts with the ambient air ejected from the synthetic jets 102 to further enhance the cooling. Similarly, as discussed above with reference to FIG. 8, a fan 50 may be disposed above the array of fins 114 and configured to blow the ambient fluid on the fins 114.

FIGS. 12-14 illustrate another heat sink 200 embodiment of the invention with distributed and integrated jet cooling. As shown for example in FIG. 12, the heat sink 200 includes a base 12 for thermal connection to at least one heated object 20. As discussed above, the heated object 20 may be any object requiring cooling. The heat sink 200 further includes an array of fins 214 thermally coupled to the base 12. At least a subset of the fins comprise synthetic jets 202 configured to eject an ambient fluid into an ambient environment of the fins 214 and base 12. For the example configuration shown in FIGS. 12 and 13, each of the fins 214 is coupled to a synthetic jet 202. However, for other arrangements (not shown) synthetic jets 202 are provided for only a subset of the fins 214.

FIG. 14 schematically depicts, in cross-sectional view, an example configuration of a synthetic jet 202 for use in the heat sink shown in FIGS. 12 and 13. For the example configuration shown in FIG. 14, the synthetic jet 202 comprises at least one flexible structure 232, a second structure 234, and at least one active material 236 coupled to the flexible structure 232. A compliant wall 238 is positioned between the flexible structure 232 and the second structure 234, thereby defining a chamber. The compliant wall defines at least one orifice, which is indicated by reference numeral 239, for facilitating fluid communication between the chamber and the ambient environment. Example active materials and example materials for the compliant wall are discussed above. Example materials for flexible structures 232, 234 include, but are not limited to metals, conductive polymers, and plastics.

For the example arrangement shown in FIG. 14, the second structure 234 comprises a second flexible structure 234, and the active material 236 is coupled to at least one of the first and second flexible structures. For the particular configuration shown in FIG. 14, the active material 236 is coupled to both flexible structures 232, 234, such that both structures can be actuated, for example upon application of an electric current. Further, for the arrangement shown in FIG. 14, the second flexible structure 234 is separated from the surface 211 of the fin 214 by a gap 216 when the synthetic jet 202 is in an unactuated state.

The operation of synthetic jet 202 is similar to that of synthetic jet 30, as discussed above with reference to FIGS. 5 and 6. Typically, a synthetic jet driver 40 is provided to apply an electrical current to the at least one active material 236, to form streams of ambient air. The synthetic jet driver 40 can be electrically coupled to the active material 236 using wires or flexible interconnects, for example. Briefly, upon application of an electrical current from synthetic jet driver 40, the active material 236 creates stress on the flexible wall 232 causing it to flex inwardly, resulting in a chamber volume change and an influx of ambient air into the chamber 270, and then outwardly, thereby ejecting the ambient air from the chamber 270 via the orifice 239. Similarly, when the active material 236 creates stress on the flexible chamber walls 232 it to expand, resulting in another chamber volume change, ambient air is drawn into the chamber 270 via the orifice 239. In this manner, the driver 40 actuates the jet 202. As note above, the synthetic jet driver 40 may be co-located with the other heat sink elements or may be remotely located. The current may be provided as a sine wave, a square wave, a triangular wave, or any other suitable waveform, and it should be appreciated that the current is not to be limited to any specific waveform.

Further, the synthetic jets 202 can be used alone or in combination with one or more fans 50, depending on the application. As discussed above with reference to FIG. 7, a fan 50 may be provided on one of an inlet and an outlet side 221, 223 of the array of fins 214, where the fan is configured to draw the ambient fluid through the fins, and where the ambient fluid drawn by the fan interacts with the ambient air ejected from the synthetic jets to further enhance the cooling. Similarly, and as discussed above with reference to FIG. 8, a fan 50 may be provided above the array of fins 214 and configured to blow the ambient fluid on the fins.

Figure 18:
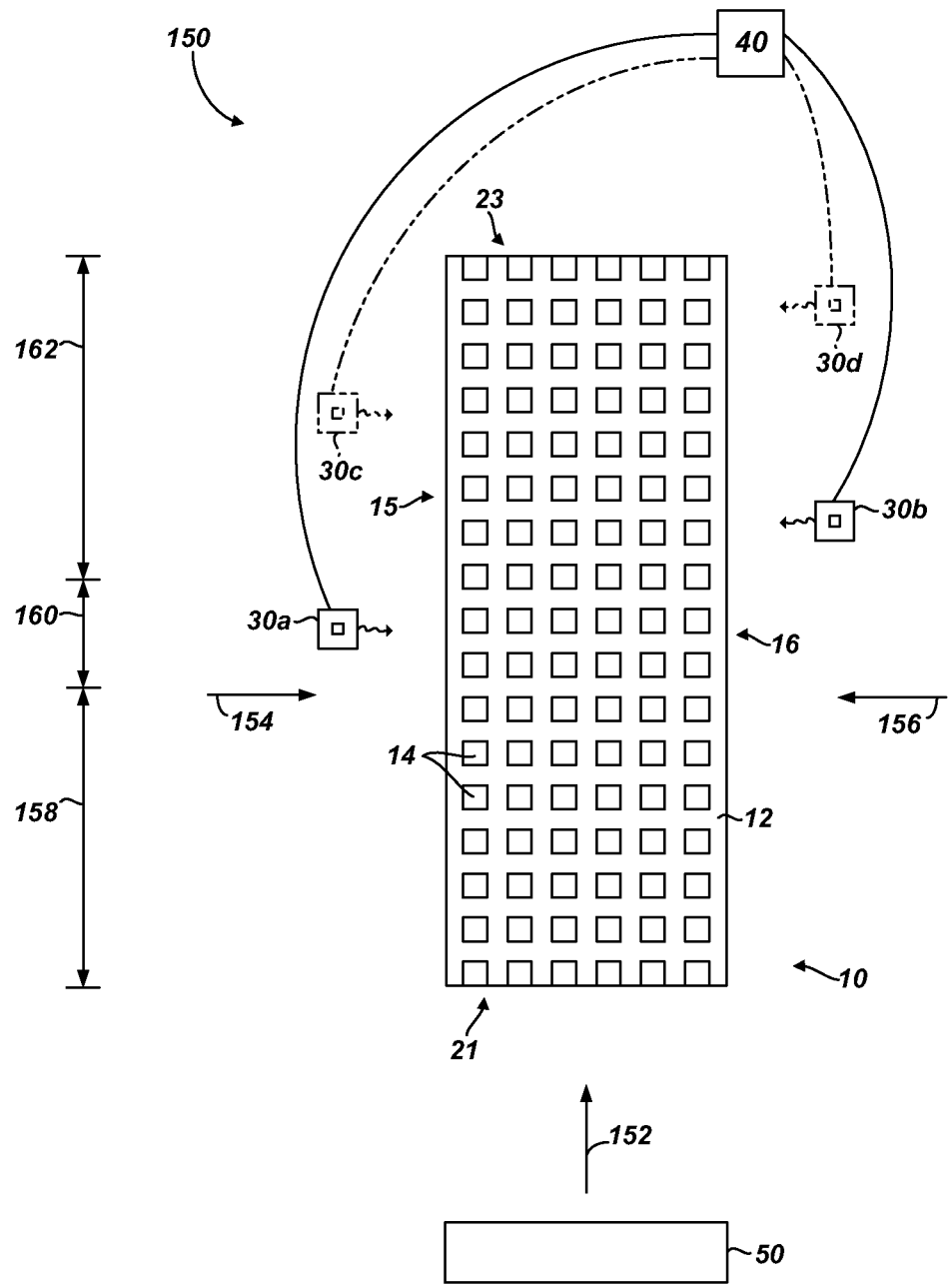
FIG. 18 schematically depicts a top view of an exemplary heat sink embodiment with forced convection and synthetic jet cooling.

FIG. 18 illustrates a cooling system 150 that includes heat sink 10 and fan 50, according to another embodiment of the invention. As shown, fan 50 is positioned at inlet side 21 of heat sink 10 to direct ambient fluid across base 12 and array of fins 14 toward outlet side 23. One skilled in the art will readily recognize that fan 50 may alternatively be positioned at outlet side 23 of heat sink 10, so as to draw the ambient fluid through and away from base 12 and array of fins 14 of heat sink 10. Fins 14 may be arranged in a rectangular array, such as shown in FIGS. 1, 12, and 18 or as a staggered array, such as shown in FIG. 15 as an example.

Cooling system 150 also includes at least two synthetic jets 30a, 30b positioned on respective sides 15, 16 of heat sink 10. Optionally, cooling system 150 includes additional synthetic jets, such as optional jets 30c, 30d (shown in phantom), positioned adjacently to heat sink 10. According to alternative embodiments, synthetic jets 30a, 30b and optional jets 30c, 30d may be configured as multi-orifice synthetic jets, similar to jets 30 illustrated in FIG. 3, or as individual synthetic jets that include a single orifice. While cooling system 150 is shown as including four synthetic jets 30a-d, one skilled in the art will recognize that the number of jets may be selected based on the system specifications and desired cooling characteristics.

In operation, fan 50 and synthetic jets 30a-d operate together to cool heat sink 10. Fan 50 directs a stream of ambient fluid across base 12 and array of fins 14 of heat sink 10 in direction 152 such that the ambient fluid ejected from fan 50 flows from inlet side 21 of heat sink 10 toward outlet side 23. Synthetic jets 30a-d enhance heat transfer by directing cool ambient fluid that has bypassed the heat sink 10 back towards it. As shown in FIG. 18, synthetic jets 30a, 30c are positioned to eject streams of fluid in direction 154 across the width of heat sink 10 through array of fins 14. Synthetic jets 30b, 30d are positioned to eject streams of fluid in direction 156, which is opposite direction 154. Thus, jets 30a, 30c and jets 30b, 30d eject fluid across heat sink 10 in directions approximately perpendicular to the direction of fluid flow from fan 50. In one exemplary embodiment, fan 50 is sized to direct a stream of ambient fluid at a velocity not more than half the velocity of the stream of ambient fluid that is ejected from jets 30a-d.

As the ambient fluid from fan 50 passes across heat sink 10, the temperature of the ambient fluid increases as it travels from upstream section 158, across central section 160, and then across downstream section 162. Thus, the effectiveness of the convective cooling from fan 50 decreases in direction 152 along the length of heat sink 10. Synthetic jets 30a-d enhance cooling of heat sink 10 by directing ambient fluid toward heat sink 10 that is cooler than the fluid from fan 50, which was been heated as it passes along the length of heat sink 10. Accordingly, in one embodiment, a first synthetic jet 30a is positioned approximately halfway along length of heat sink 10, aligned with a central section 160 of heat sink 10, to direct cooler fluid from the vicinity of the heat sink 10 into the array of fins 14. The cooler fluid from synthetic jet 30a mixes with the heated fluid from fan 50 and enhances convective cooling across heat sink 10. As shown in FIG. 18, synthetic jet 30b and optional jets 30c, 30d, are positioned farther downstream than jet 30a, adjacent to a downstream section 162 of heat sink 10, to provide additional cooling enhancement as the fluid from fan 50 that flows in direction 152 across heat sink 10 increases in temperature. One skilled in the art will recognize that the position of jets 30a-d along heat sink 10 may be selected based on design specifications and desired cooling characteristics.

As further shown in FIG. 18, synthetic jets 30a, 30b and optional jets 30c, 30d may be positioned in a staggered pattern along the length of heat sink 10 such that they are not directly aligned with one another. As such, the flow of air ejected from a jet positioned on side 15 of heat sink 10, such as synthetic jet 30*a* or 30*c*, does not directly oppose the flow from a jet positioned on side 16 of heat sink 10, such as synthetic jet 30*b* or 30*d*. In one embodiment, synthetic jets 30*a-d* are staggered adjacently to a sub-portion of the length of the heat sink 10 that includes central section 160 and downstream section 162. Alternatively, jets 30*a*, 30*b* may be positioned on a common side of heat sink, such as side 15, for example.

Therefore, in accordance with one embodiment, a system for cooling a device includes a heat sink comprising a substrate having a plurality of fins arranged thereon, a fan positioned to direct an ambient fluid in a first direction across the heat sink, and a first synthetic jet assembly comprising one of a multi-orifice synthetic jet and a plurality of single orifice synthetic jets. The first synthetic jet assembly is configured to direct the ambient fluid in a second direction across the heat sink, wherein the second direction is approximately perpendicular to the first direction.

In accordance with another embodiment, a method of fabricating a system for cooling an electronic device includes positioning a fan adjacently to a heat sink such that air flow from the fan is directed in a first direction through an array of fins of the heat sink. The method also includes positioning a first synthetic jet assembly adjacently to the heat sink such that air flow from the first synthetic jet assembly is directed in a second direction through the array of fins of the heat sink, wherein the second direction is approximately perpendicular to the first direction. The first synthetic jet assembly comprises one of a multi-orifice synthetic jet and a plurality of single orifice synthetic jets.

In accordance with yet another embodiment, a cooling system includes a fan disposed adjacently to a heat sink to direct a first stream of ambient fluid through an array of fins of the heat sink and a first multi-orifice synthetic jet positioned adjacently to the heat sink to direct a second stream of ambient fluid through the array of fins of the heat sink. The first multi-orifice synthetic jet is positioned with respect to the fan such that the second stream of ambient fluid is approximately perpendicular to the first stream of ambient fluid.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for cooling a device comprising:
a heat sink comprising a substrate having a plurality of fins arranged thereon;
a fan positioned to direct a stream of ambient fluid in a first direction towards the heat sink; and
a first synthetic jet assembly comprising one of a multi-orifice synthetic jet and a plurality of single orifice synthetic jets;
wherein the first synthetic jet assembly is configured to direct ambient fluid in a second direction across the heat sink, wherein the second direction is approximately perpendicular to the first direction;
wherein a first portion of the stream of ambient fluid directed by the fan flows across the heat sink and a second portion of the stream of ambient fluid directed by the fan bypasses the heat sink; and
wherein the second portion of the stream of ambient fluid that bypasses the heat sink is directed back toward the heat sink by the first synthetic jet assembly.

2. The system of claim 1 wherein the fan is positioned at a first side of the heat sink, the fan configured to direct the ambient fluid across a length of the heat sink; and
wherein the first synthetic jet assembly is positioned at a second side of the heat sink adjacent to the first side, the first synthetic jet assembly configured to direct the ambient fluid across a width of the heat sink.

3. The system of claim 1 wherein the plurality of fins comprises an array of pin fins.

4. The system of claim 3 wherein the plurality of fins comprises a rectangular array of pin fins.

5. The system of claim 3 wherein the plurality of fins comprises a staggered array of pin fins.

6. The system of claim 1 wherein the heat sink comprises an upstream section, a downstream section, and a central section between the upstream section and the downstream section; and
wherein the first synthetic jet assembly is aligned with at least one of the central section and the downstream section of the heat sink.

7. The system of claim 1 further comprising a second synthetic jet assembly positioned adjacent to a third side of the heat sink, the third side opposite the second side of the heat sink.

8. The system of claim 7 wherein the synthetic jets of the first synthetic jet assembly are positioned in a staggered pattern along a sub-portion of the length of the heat sink with respect to the synthetic jets of the second synthetic jet assembly.

9. The system of claim 1 wherein the fan is sized to direct ambient fluid at a velocity not more than half the velocity of ambient fluid provided from the first synthetic jet assembly.

10. A method of fabricating a system for cooling an electronic device comprising:
providing and positioning a fan adjacently to a heat sink such that air flow from the fan is directed in a first direction through an array of fins of the heat sink; and
providing and positioning a first synthetic jet assembly adjacently to the heat sink such that air flow from the first synthetic jet assembly is directed in a second direction through the array of fins of the heat sink, wherein the second direction is approximately perpendicular to the first direction, and wherein the first synthetic jet assembly comprises one of a multi-orifice synthetic jet and a plurality of single orifice synthetic jets;
wherein, in providing the fan, a fan is provided that is sized to direct a stream of ambient fluid at a velocity not more than half the velocity of the air flow provided from the one of the multi-orifice synthetic jet and the plurality of single orifice synthetic jets.

11. The method of claim 10 further comprising positioning the fan adjacently to an inlet side of the heat sink such that air flow from the fan is directed along a length of the heat sink toward an outlet side thereof.

12. The method of claim 10 further comprising:
positioning the first synthetic jet assembly adjacently to a first side of the heat sink such that air flow from the first synthetic jet assembly is directed along a width of the heat sink; and positioning a second synthetic jet assembly adjacently to a second side of the heat sink such that air flow from the second synthetic jet assembly is directed along the width of the heat sink in a direction opposite a direction of air flow from the first synthetic jet assembly.

13. The method of claim 12 further comprising positioning the second synthetic jet assembly adjacently to the second side of the heat sink such that air flow from the second synthetic jet assembly is non-opposing to air flow from the first synthetic jet assembly.

14. The method of claim 10 wherein a first portion of the air flow directed by the fan flows across the heat sink and a second portion of the air flow directed by the fan bypasses the heat sink; and wherein the second portion of the air flow that bypasses the heat sink is directed back toward the heat sink by the first synthetic jet assembly.

15. A cooling system comprising:
a fan disposed adjacently to a heat sink to direct a first stream of ambient fluid through an array of fins of the heat sink;
a first multi-orifice synthetic jet positioned adjacently to the heat sink to direct a second stream of ambient fluid through the array of fins of the heat sink; and
a synthetic jet driver electrically coupled to the first multi-orifice synthetic jet to actuate the first multi-orifice synthetic jet;
wherein the first multi-orifice synthetic jet is positioned with respect to the fan such that the second stream of ambient fluid is approximately perpendicular to the first stream of ambient fluid; and
wherein the fan is sized to direct the first stream of ambient fluid at a velocity not more than half the velocity of the second stream of fluid provided from the first multi-orifice synthetic jet.

16. The cooling system of claim 15 wherein the fan is disposed at an inlet side of the heat sink; and wherein the first multi-orifice synthetic jet is disposed at a first side of the heat sink, the first side adjacent to the inlet side.

17. The cooling system of claim 15 further comprising a second multi-orifice synthetic jet positioned adjacently to the heat sink to direct a third stream of ambient fluid through the array of fins of the heat sink.

18. The cooling system of claim 17 wherein the second multi-orifice synthetic jet is positioned at a second side of the heat sink, the second side opposite the first side.

19. The cooling system of claim 17 wherein the first multi-orifice synthetic jet is positioned a first distance from an intersection of the first side with the inlet side of the heat sink; and wherein the second multi-orifice synthetic jet is positioned a second distance from an intersection of the second side with the inlet side of the heat sink, the second distance greater than the first distance.

20. The cooling system of claim 15 wherein the fan is sized to direct the first stream of ambient fluid at a first velocity; and wherein the first multi-orifice synthetic jet is sized to direct the second stream of ambient fluid at a second velocity, the second velocity greater than the first velocity.

* * * * *